United States Patent [19]
Maki et al.

[11] Patent Number: 5,665,802
[45] Date of Patent: Sep. 9, 1997

[54] POLYIMIDE FILM AND MANUFACTURING METHOD THEREOF

[75] Inventors: Haruhiko Maki, Kyoto; Hirosaku Nagano, Ohtsu; Yoshiaki Inaba, Osaka, all of Japan

[73] Assignee: Kanegafuchi Kagaku Kogyo Kabushiki Kaisha, Osaka, Japan

[21] Appl. No.: 711,072

[22] Filed: Sep. 9, 1996

Related U.S. Application Data

[63] Continuation of Ser. No. 494,791, Jun. 26, 1995, abandoned, which is a continuation of Ser. No. 796,915, Nov. 26, 1991, abandoned, which is a continuation of Ser. No. 379,837, Jul. 14, 1989, abandoned.

[30] Foreign Application Priority Data

Jul. 15, 1988 [JP] Japan .................. 63-177526

[51] Int. Cl.⁶ .............. C08K 5/523; C08K 5/521; C08K 5/53
[52] U.S. Cl. .............. 524/141; 524/139; 524/145; 524/147; 524/414; 524/415; 524/416; 524/417; 524/154; 428/473.5
[58] Field of Search .................. 524/141, 145, 524/153, 414, 600, 415, 416, 417, 139, 147, 154; 528/289, 286, 353; 428/473.5

[56] References Cited

U.S. PATENT DOCUMENTS

| | | | |
|---|---|---|---|
| 2,733,226 | 1/1956 | Hunter | 524/151 |
| 3,047,608 | 7/1962 | Friedman et al. | 528/400 |
| 3,249,588 | 5/1966 | Gall et al. | 528/352 |
| 3,551,200 | 12/1970 | Stivers | 528/351 |
| 3,565,847 | 2/1971 | Dileone | 524/141 |
| 3,607,387 | 9/1971 | Lanza et al. | 428/458 |
| 3,629,180 | 12/1971 | Yoda et al. | 528/353 |
| 3,691,136 | 9/1972 | Serres et al. | 524/141 |
| 3,714,116 | 1/1973 | Scalco | 524/147 |
| 4,448,957 | 5/1984 | Nagaoka | 528/352 |
| 4,470,944 | 9/1984 | Asakura et al. | 524/600 |
| 4,508,861 | 4/1985 | Avakian | 524/141 |
| 4,742,099 | 5/1988 | Nagano et al. | 524/115 |

OTHER PUBLICATIONS

CA 104:34802u (1986) Ittiev, A. B. et al.

*Primary Examiner*—Veronica P. Hoke
*Attorney, Agent, or Firm*—Sughrue, Mion, Zinn, Macpeak & Seas

[57] ABSTRACT

The present invention provides an improved grade of polyimide containing an organic phosphorus compound, a film composed thereof and a method of making the aforementioned film. According to the present invention, it is possible to obtain a polyimide film improved in mechanical strength.

19 Claims, No Drawings

POLYIMIDE FILM AND MANUFACTURING METHOD THEREOF

This is a Continuation of application Ser. No. 08/494,791 filed Jun. 26, 1995, now abandoned which is a Continuation of application Ser. No. 07/796,915 filed Nov. 26, 1991, now abandoned, which is a Continuation of application Ser. No. 07/379,837 filed Jul. 14, 1989, now abandoned.

BACKGROUND OF THE INVENTION

1. Field of the Invention

The present invention relates to an improved polyimide and polyimide film prepared therefrom as well as a manufacturing method of the polyimide film.

2. Description of the Prior Art

Polyimide is known for its outstanding heat resistance, low-temperature resistance, resistance to chemicals, electric insulation property and mechanical strength etc, and has a wide scope of use like, among others, electric insulation materials, heat insulation materials and base films for flexible printed circuit boards (PCB). When used as material for flexible PCB, which is an important use for a polyimide film, the manufactured PCB is often used for a prolonged period in a deformed state or subjected to repeated contraction or bending. Hence, in this field of use, mechanical properties of a polyimide film are very important, especially its tensile strength and anti-bending property are critical.

It is also often the case that polyimide film is used, as in the manufacture of flexible PCB, in a form laminated with a copper foil, adhesive layer and the like. In such a case the problem was that a laminated film as such with its thickness increased had its physical properties, especially repeated flexural strength, markedly deteriorated or lowered.

Hence, it was strongly desired to have the mechanical strength of polyimide film as a base, flexural failure strength in particular, much more improved when it was to be used by being laminated with a copper foil and an adhesive layer.

As will be described later, the present invention consists in mixing some organic phosphorus compound to polyimide, but as far as the present inventors investigated prior arts involving the use of phosphorus compound as an additive to heat resistant synthetic high polymer, they found out Japanese Laid-open Application No. 131249/'82 and Japanese Laid-open Application No. 221454/'85. The former relates to a thermoplastic polyamideimide resin composition in which organic phosphonite is mixed with aromatic polyamideimide and the latter discloses a technique relating to thermoplastic polyetherimide incorporating sterically hindered phenol to polyetherimide, aryl phosphonite, organic phosphonite etc. Polyamideimide and polyetherimide are both thermoplastic resins and, moreover, both techniques are aimed at preventing thermal decomposition of melted thermoplastics. Thus, any of the above-identified prior arts neither discloses nor suggests anyway the technical concept of the present invention.

SUMMARY OF THE INVENTION

The object of the present invention is to provide a grade of polyimide giving a polyimide film improved in mechanical strength.

Another object of this invention is to provide a grade of a polyimide film improved in mechanical strength.

A further object of this invention is to provide a method for manufacturing a polyimide film improved in mechanical strength.

Still further objects and advantages of this invention will be apparent to anybody of ordinary skill by the detailed description below.

As a result of extensive and intensive studies in order to accomplish the aforementioned objects, the present inventors have discovered that certain compounds have a special effect of controlling the process of formation of polyimide and, after studying the possibility of utilizing it to contribute to improvement of the resin's mechanical strength, they have succeeded in improving the mechanical strength of polyimide without changing its molecular structure.

The essential feature of the improved grade of polyimide according to the present invention is that an organic phosphorus compound is incorporated in polyimide.

The essential feature of the invented method of manufacturing a polyimide film, on the other hand, is that an organic phosphorus compound is contained in, at least, either of a polyimide precursor or a dehydration-cyclizing agent or the both before filming thereof.

DETAILED DESCRIPTION OF THE INVENTION

As polyimide, there may be included, according to the present invention, all known grades of polyimide prepared by dehydration-cyclization of an organic solvent solution of polyamide acid as a precursor of polyimide obtainable through reaction of an organic solvent solution of organic diamine with organic tetracarboxylic acid dianhyhdride under heating or by the use of a dehydration-cyclizing agent.

As organic diamines, there may be included, according to the present invention, any organic diamines represented by the general formula (I);

$$H_2N-R_1-NH_2 \quad (I)$$

wherein $R_1$ is an aliphatic group, a phenylene group, a naphthalene group, a biphenylene group, a

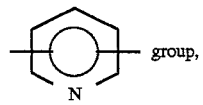 group, or divalent organic group of the general formula (II):

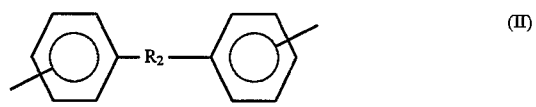

[where $R_2$ is an alkylene group having 1 to 4 carbon atoms,

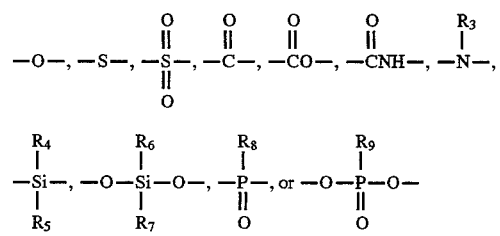

(where $R_3$ to $R_9$ are each an aliphatic or aromatic group)] or the compounds thereof. Specific examples thereof are metaphenylenediamine, paraphenylenediamine, 3,3'-dimethoxy-4,4'-diaminobiphenyl, 3,3'-dichloro-4,4'diaminobiphenyl, 4,4'-diaminoparaterphenyl, 4,4,-bis(4-aminophenoxy)biphenyl, 4,4'-diaminooctafluorobiphenyl, 4,4'-diaminobiphenyl, 4,4'-diaminodiphenylpropane, 2,2-bis [4-(4-aminophenoxy)phenyl] propane, 2,2-bis[4-(4-aminophenoxy)phenyl]hexafluoropropane, 2,2-bis(4-aminophenyl)propane, 2,2-bis(4-aminophenyl) hexafluoropropane, 2,2-bis(3-hydroxy-4-aminophenyl) propane, 2,2-bis(3-hydroxy-4-aminophenyl) hexafluoropropane, 4,4'-diaminodiphenylmethane, bis(3-ethyl-4-aminophenyl)methane, bis(3-methyl-4-aminophenyl)methane, bis(3-chloro-4-aminophenyl) methane, benzidine, 4,4'-diaminodiphenylsulfone, 3,3'-diaminodiphenylsulfone, bis[4-(4-aminophenoxy) phenyl] sulfone, bis[4-(3-aminophenoxy)phenyl]sulfone, bis[4-(2-aminophenoxy)phenyl]sulfone, 1,4-bis(4-aminophenoxy) benzene, 1,3-bis(4-aminophenoxy)benzene, 1,3-bis(3-aminophenoxy)benzene, 1,4-bis(4-aminophenyl)benzene, 2,2', 5,5'-tetrachloro-4,4'-diaminobiphenyl, 4,4'-diaminodiphenylsulfide, 3,3'-diaminodiphenylether, 3,4'-diaminobiphenyl ether, bis[4-(4-aminophenoxy)phenyl] ether, 4,4'-diaminodiphenylether, 2,6-diaminopyridine, bis(4-aminophenyl)diethylsilane, bis(4-aminophenyl) diphenylsilane, 3,3'-dichlorobenzidine, bis(4-aminophenyl) ethylphosfine oxide, bis(4-aminophenyl)-N-phenylamine, bis(4-aminophenyl)-N-methylamine, 1,5-diaminonaphthalene, 3,3'-dimethyl-4,4'-diaminobiphenyl, 3,3'-dimethoxybenzidine, 4,4'-methylenedianiline, dimethylbenzidine, 2,4'-diaminotoluene, methaphenylendiamine, ethylenediamine, trimethylenediamine, tetramethylenediamine, pentamethylenediamine, hexamethylenediamine, 1,7-diaminoheptane, 1,8-diaminooctane, 1,9-diaminononane, 1,10-diaminodecane, 9,9-bis(4-aminophenyl)-10-hydroanthracene, orthotridine sulfon et cetera. These may be used singly or in combination of two or more. Further, partial use of multi-valent amine compounds such as 3,3', 4,4'-biphenyltetraamine and 3,3', 4,4'-tetraaminodiphenyl ether is also feasible.

Of these compounds, as particularly preferable ones there may be included paraphenylene diamine, 3,3'-dimethyl-4,4'-diaminodiphenyl or 4,4'-diaminodiphenyl ether.

Organic tetracarboxylic acid dianhydride which is employed for the purpose of this invention is a compound represented by the general formula (III);

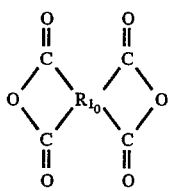

wherein $R_{10}$ is an aliphatic group,

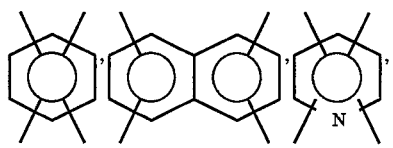

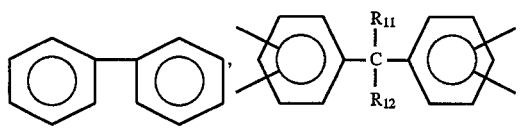

(where $R_{11}$ and $R_{12}$ are a hydrogen atom or a methyl group respectively),

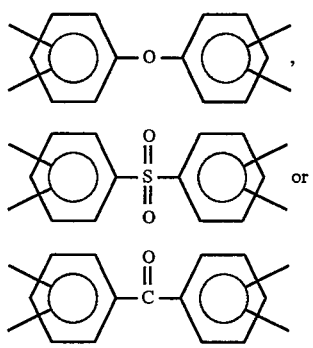

or a mixture thereof. Specific examples of the compounds are pyromellitic dianhydride, 2, 3, 6, 7-naphthalene tetracarboxylic acid dianhydride, 3,3', 4,4'-biphenyltetracarboxylic acid dianhydride, 3,3', 4,4'-benzophenonetetracarboxylic acid dianhydride, naphthalene-1,2,5,6-tetracarboxylic dianhydride, 2,2', 3,3'-diphyenyltetracarboxylic acid dianhydride, 2,3,5,6-pyridinetetracarboxylic acid dianhydride, 2,2-bis(3,4-dicarboxyphenyl) propane dianhydride, bis (3,4-dicarboxyphenyl) sulfone dianhydride, 3,4,9,10-perylenetetracarboxylic acid dianhydride, bis (3,4-dicarboxyphenyl) ether dianhydride, 1,2,4,5-naphthalenetetracarboxylic acid dianhydride, 1,2,5,8-naphthalenetetracarboxylic acid dianhydride, 2,2-bis(2,3-dicarboxyphenyl)propane dianhydride, 1,1-bis(2,3-dicarboxyphenyl)ethane dianhydride, 1,1-bis(3,4-dicarboxyphenyl) ethane dianhydride, bis(2,3-dicarboxyphenyl)methane dianhydride, bis(3,4-dicarboxyphenyl) methane dianhydride, bis (3,4-dicarboxyphenyl)sulfone dianhydride, benzene-1,2,3,4-tetracarboxylic acid dianhydride, 3,4,3',4'-benzophenonetetracarboxylic acid dianhydride et cetera. These may be used singly or in combination of two or more. Pyromellitic acid dianhydride or 3,3', 4,4'-biphenyltetracarboxylic acid dianhydride are, among others, especially preferred.

As regards the organic solvent, it is possible to use, for example, N,N-dimethylformamide, N,N-dimethylacetamide, N,N-diethylformamide, N,N-diethylacetamide, N,N-dimethylmethoxyacetamide, dimethylsulfoxide, hexamethylphosphoramide, N-methyl-2-pyrrolidone or dimethylsulfone, or a mixture of two or more such compound, proper mixtures of any such solvent with benzene, toluene, xylene, benzonitrile, dioxane or cyclohexane. It is, however, important to use a solvent which is good not only for the organic diamine, but also for organic tetracarboxylic acid dianhydride and polyamide acid. Therefore, it is preferable to use N,N-dimethylformamide, N, N-dimethylacetamide, dimethylsulfoxide or N-methyl-2-pyrrolidone, or a mixture thereof.

Polyamide acid and polyimide obtained by conversion of polyamide acid may be represented by various structural formulae depending on the combination of the aforementioned organic diamine and organic tetracarboxylic acid dianhydride, all being applicable in the present invention. Especially, polyimide generally in use represented by e.g. the general formula (A);

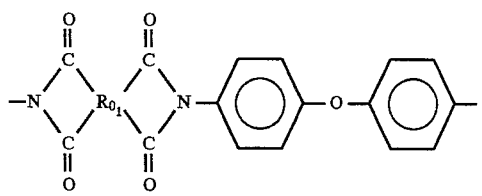

(A)

wherein $R_{01}$ is a 4-valent organic group, or by the general formula (B);

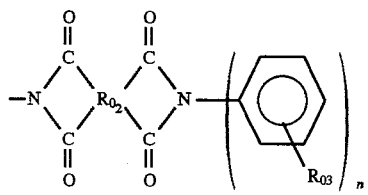

(B)

wherein $R_{02}$ is a 4-valent organic group, $R_{03}$ is at least one selected from hydrogen atom, halogen group, hydroxyl group, methyl group and methoxy group, and n is 1, 2 or 3, and the present invention is well applicable to a mixture thereof. More specifically, preferred is polyimide comprising 4,4'-diaminodiphenyl ether and pyromellitic acid dianhydride as main components for better balancing of various properties.

In one of the methods obtaining an improved grade of polyimide, first organic tetracarboxylic acid dianhydride is added under stirring to an organic solvent solution of organic diamine, and organic solvent solution of polyamide acid is formed. Then, an organic phosphorus compound is added to the resulting organic solvent solution of the polyamide acid and mixed under stirring homogeneously. Then, it is as well be possible to dissolve the organic phosphorus compound in an organic solvent before addition for quicker and more homogeneous mixing. The organic solvent solution of polyamide acid mixed with the organic phosphorus compound is made into a desired form by e.g. film casting on an endless belt and then converting it into polyimide by dehydration-cyclization of polyamide acid by means of heating and then a film of polyimide containing an organic phosphorus compound is formed.

The phosphorus compound is substantially unreactive to polyamide acid and polyimide, hence there is no likelihood of changing the molecular structure of the latter. The amount of the organic phosphorus compound added is so set that the content thereof is 0.5–5 weight %, preferably 0.7–1.5 weight % based on polyimide. If the content of the organic phosphorus compound is less than 0.5 weight %, the effect of the contained organic phosphorus compound, that is, the effect to improve the mechanical strength of polyimide is scarcely noticeable, meanwhile when the content of the organic phosphorus compound exceeds 5 weight %, it causes discoloration of polyimide and also disadvantage of marked increase of the quantity of the residual volatile substances.

As organic phosphorus compounds used in the present invention, there may be included, among others, triphenyl phosphate, methyl diethylphosphonoacetate, triphenyl phosphite, phosphoric acid tri (2-ethylhexyl) ester, tris-(2, 3-dibromopropyl) phosphate, tris (2-chloroethyl) phosphate, tris (butoxyethyl) phosphate, tri-n-butyl phosphite, ethyl diethylphosphonoacetate, tris (1,3-dichloro-2-propyl) phosphate, trimethyl phosphite, trimethyl phosphate, triethyl phosphite, hexamethyltriamide phosphate, di (2-ethylhexyl) -phosphoric acid, trimethyl phosphonoacetate, triethyl phosphate, bis (2-ethylhexyl) hydrogenphosphate, dilauryl phenyl phosphite, phenylphosphonic dichloride, tridecyl phosphite, disodium phenyl phosphate, (4-ethoxybenzyl) triphenylphosphonium bromide, sodium glycerophosphate, di-p-tolylphosphoric acid sodium salt, disodium phenyl phosphate, di-p-tolylphosphoric acid calcium salt, phenylphosphonic acid, tris (4-tert-butylphenyl) phosphate, (4-butoxybenzyl) triphenylphosphonium bromide, triphenyl phosphine, iproniazid phosphate, 3-phosphoglyceric acid barium salt, methyl (triphenylphosphoranylidene) acetate, triphenylphosphine oxide, methyltriphenylphosphonium bromide, ethyltriphenylphosphonium bromide, butyltriphenylphosphonium bromide, 2-cyanoethyl phosphate barium salt, histamine diphosphate, benzyltriphenylphosphonium chloride, phosphonoacetic acid, p-nitrophenylphosphate disodium salt, 1-naphthyl phosphate monosodium salt monohydrate, vinyltriphenylphosphonium bromide, adenosine-3',5'-cyclic monophosphate, adenosine-5'-monophosphate sodium salt, phenyl dichlorophosphate, creatine phosphate sodium salt, tricresyl phosphate, urea phosphate ortho, diphenylphosphinic acid, bis[4-(methoxycarbonyl)phenyl] phosphoric acid sodium salt, , 2-carboxyethylphosphonic acid, diphenyl phosphate, tetraphenylphosphonium chloride, diethyl cyanomethylphosphonate, (3-bromopropyl) triphenylphosphonium bromide, cyclopropyltriphenylphosphonium bromide, bis (pentafluorophenyl) phenylphosphine, dimethyl (2-oxopropyl) phosphonate, (chloromethyl) triphenylphosphonium chloride, tetra-n-butylphosphonium bromide, triethyl phosphite, ethyl dichlorophosphate, p-nitrophenyl phosphorodichloridate, tri-n-butyl phosphine and hexamethylphosphorous triamide. It is also possible to use other compounds with these as a main skeleton or chemically modified.

In the present invention, inorganic phosphorus compounds may be used in a small amount in conjunction with the foregoing organic phosphorus compounds. Examples of the inorganic phosphorus compound are hypophosphorous acid, lithium phosphate, ammonium phosphate dibasic, ammonium phosphate monobasic, manganese (II) phosphate monobasic, potassium phosphate dibasic, disodium hydrogen phosphate, potassium pyrophosphate, phosphorous acid, phosphoric acid, pyrophosphoric acid, phosphoric acid meta, barium phosphate dibasic, ammonium phosphate tribasic, potassium phosphate monobasic, calcium phosphate monobasic, sodium dihydrogen phosphate dihydrate, sodium polyphosphate, sodium ammonium hydrogen phosphate, sodium hydrophosphite, calcium phosphate tribasic and zinc phosphate.

Investigation about the polyimide film containing an organic phosphorus compound in connection with the present invention proved that marked improvement was noticeable in mechanical properties.

Described above is one embodiment of the present invention, but this invention is embodiable in other forms, too.

For example, in the above embodiment, polyamide acids containing some organic phosphorus compound are caused to dehydration-cyclize by heating for resultant conversion into polyimide, but it is also possible to mix a dehydration-cyclization agent or this together with a catalyst in an organic solvent solution of polyamide acid to thereby dehydration-cyclize chemically, and it is also possible to do heating simultaneously.

As dehydration-cyclization agent, there may be included, for example, organic carboxylic acid anhydride, N,N'-dialkylcarbodiimides, halogenides of lower fatty acids, halogenides of halogenated lower fatty acids, halogenated lower fatty acid anhydrides, allylphosphonic acid dihalogenide and the like as well as mixtures thereof. Of these, particularly preferred is acetic acid anhydride, and besides, as preferred dehydration-cyclization agent are ketene, benzoic acid anhydride et cetera.

As catalyst suited are, for example, pyridine, isoqinoline and tertiary amines. Specific examples are 3,4-lutidine, 3,5-lutidine, 4-methylpyridine, 4-isopropylpyridine, N-dimethylbenzylamine, 4-benzylpyridine, 4-dimethyldodecylamine, picolines, triethylamine and the like. Of these, particularly preferred is isoquinoline.

In the above embodiment the organic phosphorus compound is mixed with a formed organic solvent solution of polyamide acid, but it is also possible to mix an organic phosphorus compound in an organic solvent solution of organic diamine or organic tetracarboxylic acid dianhydride to thereby form polyamide acid.

Further, it is also possible to premix an organic phosphorus compound with a dehydration-cyclization agent and thereby mix the dehydration-cyclization agent and the organic phosphorus compound with the polyamide acid.

Thus, the organic solvent solution of polyamide acid with addition of an organic phosphorus compound in various forms as mentioned above is extruded in a film form or film cast onto a casting drum or an endless belt and is dehydration-cyclized on said drum or belt to be converted into polyimide. After the film has been cured to become at least self-supporting, it is peeled off the drum or the belt and a polyimide film is thus manufactured.

The thickness of polyimide film containing an organic phosphorus compound may properly be set as necessary, and there is no particular limitation. With the polyimide film of the present invention improved in mechanical strength, however, its film thickness is desired to be 12.5–150 µm, more preferably in a range of 75–130 µm, for improvement in flexibility.

The present invention will be explained in more detail by way of examples but the present invention is by no means limited thereby.

EXAMPLE 1

A 15 weight % dimethylformamide (DMF) solution containing polyamide acid was prepared in an ice bath by reacting 4,4'-diaminodiphenyl ether (ODA) as organic diamine and pyromellitic dianhydride (PMDA) as organic tetracarboxylic acid dianhydride, respectively, in approximately equimolecular amounts. To the resulting solution of polyamide acid, triphenyl phosphate was added as organic phosphorus compound in the amount of 1.0 weight % of polyimide. Further, acetic acid anhydride as a dehydration-cyclization agent in twice the molarity of carboxylic group of polyamide acid and isoquinoline as a catalyst in half the molarity of carboxylic group of polyamide acid were mixed, then the resulting mixed solution of polyamide acid was cast over a smooth surface and then it was put into a drying chamber with an inside temperature of 100° C. and was kept therein for 10 minutes.

After converting polyamide acid into polyimide by dehydration-cyclization and simultaneous evaporation of the volatile component to thereby make a self-supporting film of polyimide, the formed polyimide film was peeled off the smooth surface and, with the resulting polyimide film mechanically fixed at four corners, heat treatment was applied. The conditions of heat treatment were 10 minutes in an atmosphere of 300° C., this followed by retention for 3 minutes in an atmosphere of 420° C. The thickness of polyimide film so obtained was approximately 125 µm.

As to this polyimide film, measurement was taken of the tensile strength and flexibility as mechanical properties. The measuring method adopted was JIS-C2318 for tensile strength and ASTMD-2176 for flexibility. Also, the external appearance of polyimide film was visually examined with regard to hue et cetera. The result is shown in Table 1.

EXAMPLE 2

Polyimide film was manufactured under the same conditions as in Example 1. However, triphenyl phosphate was added to polyamide acid solution in the amount of 2.0 weight % of polyimide.

As to the polyimide film so obtained, the result of measurement and investigation of its tensile strength, flexibility and external appearance was as shown in Table 1.

EXAMPLE 3

Polyimide film was manufactured under the same conditions as in Example 1. However, triphenyl phosphate was added to polyamide acid solution in the amount of 5.0 weight % of polyimide.

As to the polyimide film so obtained, the result of measurement and investigation of its tensile strength, flexibility and external appearance was as shown in Table 1.

CONTROL EXAMPLE 1

Polyimide film was manufactured under the same conditions as in Example 1. Triphenyl phosphate was not added to polyamide acid solution, however, and polyimide film not containing organic phosphorus compound was obtained.

As to the polyimide film so obtained, the result of measurement and investigation of its tensile strength, flexibility and external appearance was as shown in Table 1.

EXAMPLE 4

A 15 weight % dimethylformamide (DMF) solution containing polyamide acid was prepared in an ice bath by reacting paraphenylenediamine (P-PDA) as organic diamine and biphenyltetracarboxylic acid dianhydride as organic tetracarboxylic dianhydride, respectively, in approximately equimolecular amounts. To the resulting solution of polyamide acid, triphenyl phosphate was added to its polyamide acid solution in the amount of 1.0 weight % of polyimide. And a polyimide film was prepared under the same conditions as in Example 1.

As to the polyimide film so obtained, the tensile strength, flexibility and external appearance were measured and investigated in the same way as described in Example 1, and the result was as shown in Table I.

EXAMPLE 5

A 15 weight % dimethylformamide (DMF) solvent solution containing polyamide acid was prepared in an ice bath by reacting 4,4'-diaminodiphenyl ether (ODA) as organic diamine and biphenyltetracarboxylic acid dianhydride as organic tetracarboxylic acid dianhydride, respectively, in approximately equimolecular amounts. To this polyamide acid solution, triphenyl phosphate was added in the amount of 1.0 weight % of polyimide. And a polyimide film was manufactured under otherwise the same conditions as in Example 1.

As to the polyimide film so obtained, the tensile strength, flexibility and external appearance were measured and investigated in the same way as described in Example 1, and the result was as shown in Table 1.

EXAMPLE 6

A 15 weight % dimethylformamide (DMF) solution containing polyamide acid was prepared in an ice bath by reacting a 4:1 mixture by weight of 4,4'-diaminodiphenyl ether (ODA) and paraphenylenediamine (P-PDA) as organic diamine and pyromellitic dianhydride (PMDA) as organic tetracarboxylic acid dianhydride, respectively, in such amounts that amino group and acid anhydride group are appoximately equimolecular. To this polyamide acid solution, triphenyl phosphate was added in the amount of 1.0 weight % of polyimide. A polyimide film was manufactured under the same conditions as in Example 1.

As to the polyimide film so obtained, tensile strength, flexibility and external appearance were measured and investigated in the same way as described in Example 1, and the result was as shown in Table 1.

TABLE 1

| Ex- ample | Polyamide acid composition | Amount added (Wt. %) | Tensile strength (Kg/mm²) | Flexi- bility (times) | Appearance |
| --- | --- | --- | --- | --- | --- |
| 1 | (ODA) + (PMDA) | 1.0 | 23.5 | 2340 | Normal |
| 2 | (ODA) + (PMDA) | 2.0 | 24.8 | 2790 | Normal |
| 3 | (ODA) + (PMDA) | 5.0 | 24.5 | 2650 | Slightly changed |
| 4 | (P-PDA) + (BPDA) | 1.0 | 29.2 | 2120 | Normal |
| 5 | (ODA) + (BPDA) | 1.0 | 21.5 | 1980 | Normal |
| 6 | (ODA + P-PDA) + (PMDA) | 1.0 | 29.5 | 2090 | Normal |
| Control exam. 1 | (ODA) + (PMDA) | — | 17.5 | 580 | Normal |

ODA; 4,4'-diaminodiphenyl ether
PMDA; Pyromellitic dianhydride
P-PDA; Paraphenylenediamine
BPDA; Biphenyl tetracarboxylic dianhydride

EXAMPLE 7

A 15 weight % dimethylformamide (DMF) solution containing polyamide acid was prepared in an ice bath by reacting 4,4'-diaminodiphenylether (ODA) as organic diamine and pyromellitic dianhydride (PMDA) as organic tetracarboxylic acid dianhydride, in approximately equimolecular amounts. To the resulting polyamide acid solution, triphenyl phosphite was added as organic phosphorus compound in the amount of 2.0 weight % of polyimide. Thereafter, a polyimide film was manufactured in the same way as described in Example 1. The thickness of polyimide film was approx. 125 μm as in Example 1.

As to polyimide film so obtained, tensile strength, flexibility and external appearance were measured and investigated in the same way as described in Example 1, and the result was as shown in Table 2.

EXAMPLE 8

To the same polyamide acid solution as described in Example 7, trioctyl phosphate was added as organic phosphorus compound in the amount of 2.0 weight % of polyimide and a polyimide film was manufactured.

As to the polyimide film so obtained, tensile strength, flexibility, and external appearance were measured and investigated in the same way as described in Example 1, and the result was as shown in Table 2.

EXAMPLE 9

To the same polyamide acid solution as described in Example 7, tris (butoxyethyl) phosphate was added as organic phosphorus compound in the amount of 2.0 weight % of polyimide.

As to the polyimide film so obtained, tensile strength, flexibility and external appearance were measured and investigated in the same way as described in Example 1 and the result was as shown in Table 2.

EXAMPLE 10

To the same polyamide acid solution as described in Example 7, diethylphosphonoethyl acetate was added as organic phosphorus compound in the amount of 2.0 weight % of polyimide and a polyimide film was manufactured.

As to the polyimide film so obtained, tensile strength, flexibility and external appearance were measured and investigated in the same way as described in Example 1 and the result was as shown in Table 2.

EXAMPLE 11

To the same polyamide acid solution as described in Example 7, trimethyl phosphite was added as organic phosphorus compound in the amount of 2.0 weight % of polyimide and a polyimide film was manufactured.

As to the polyimide film so obtained, tensile strength, flexibility and external appearance were measured and investigated in the same way as described in Example 1 and the result was as shown in Table 2.

EXAMPLE 12

To the same polyamide acid solution as described in Example 7, trimethyl phosphate was added as organic phosphorus compound in the amount of 2.0 weight % of polyimide and a polyimide film was manufactured.

As to the polyimide film so obtained, tensile strength, flexibility and external appearance were measured and investigated in the same way as described in Example 1 and the result was as shown in Table 2.

EXAMPLE 13

To the same polyamide acid solution as described in Example 7, hypophosphoric acid was added as organic phosphorus compound in the amount of 2.0 weight % of polyimide and a polyimide film was manufactured.

As to the polyimide film so obtained, tensile strength, flexibility and external appearance were measured and investigated in the same way as described in Example 1 and the result was as shown in Table 2.

EXAMPLE 14

To the same polyamide acid solution as described in Example 7, ethyl hypophosphite was added as organic phosphorus compound in the amount of 2.0 weight % of polyimide and a polyimide film was manufactured.

As to the polyimide film so obtained, tensile strength, flexibility and external appearance were measured and investigated in the same way as described in Example 1 and the result was as shown in Table 2.

EXAMPLE 15

To the same polyamide acid solution as described in Example 7, trimethyl phosphonoacetate was added as organic phosphorus compound in the amount of 2.0 weight % of polyimide and a polyimide film was manufactured.

As to the polyimide film so obtained, tensile strength, flexibility and external appearance were measured and investigated in the same way as described in Example 1 and the result was as shown in Table 2.

TABLE 2

| Example | Organic phosphorus compound | Amount added (Wt. %) | Tensile strength (Kg/mm$^2$) | Flexibility (Times) | Appearance |
|---|---|---|---|---|---|
| 7 | Triphenyl phosphite | 2.0 | 23.5 | 2280 | Normal |
| 8 | Trioctyl phosphate | 2.0 | 24.6 | 2920 | Normal |
| 9 | Tris (butoxyethyl) phosphate | 2.0 | 23.7 | 2450 | Normal |
| 10 | Diethylphosphono-ethyl acetate | 2.0 | 22.9 | 2080 | Normal |
| 11 | Trimethyl phosphite | 2.0 | 24.0 | 2750 | Normal |
| 12 | Trimethyl phosphate | 2.0 | 22.0 | 2120 | Normal |
| 13 | Hypophosphorous acid | 2.0 | 23.8 | 2260 | Normal |
| 14 | Ethyl phosphite | 2.0 | 21.2 | 1870 | Normal |
| 15 | Trimethylphosphono-acetate | 2.0 | 24.9 | 2340 | Normal |

The present invention has enabled marked improvement of the mechanical properties of polyimide through incorporation of a predetermined amount of the specified organic phosphorus compound into a known polyimide.

The present invention has outstanding effects that the method of manufacturing a film of polyimide containing said organic phosphorus compound requires no complicated manipulation or processing and that an improved grade of polyimide film can be manufactured cheaply and quickly thereby.

What is claimed is:

1. A method of manufacturing a polyimide film having a thickness of at least 75 μm and which is excellent in tensile strength and flexibility, which comprises adding a dehydration-cyclization agent, a catalyst and an organic phosphorus compound to polyamide acid and then film-forming, wherein the organic phosphorus compound is added in a range of 0.5–5 weight % based on polyimide.

2. A method of manufacturing a polyimide film according to claim 1, wherein the organic phosphorus compound is added to an organic solvent solution of polyamide acid, followed by film-forming.

3. A method of manufacturing a non-melt processable polyimide film according to claim 1, wherein the organic phosphorus compound is added to a dehydration-cyclization agent, followed by film-forming.

4. A method of manufacturing a polyimide film according to claim 1, wherein the organic phosphorus compound is added in a range of 0.7–1.5 weight % based on polyimide.

5. A method of manufacturing a polyimide film according to claim 1, 2 or 3, wherein the polyimide is at least one selected from polyimides represented by the general formulae (A) and (B);

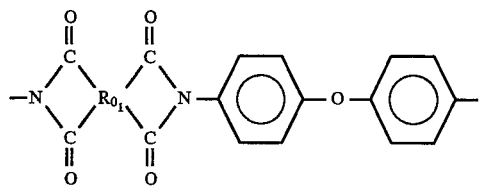

(A)

wherein $R_{01}$ is an 4-valent organic group;

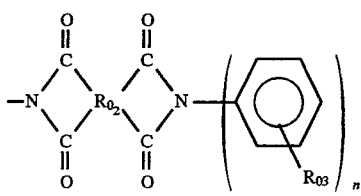

(B)

wherein $R_{02}$ is a 4-valent organic group, $R_{03}$ is at least one member selected from the group consisting of hydrogen atom, halogen group, hydroxyl group, methyl group and methoxy group, and n is 1, 2 or 3.

6. A method of manufacturing a non-melt processable polyimide film according to claim 1, 2 or 3, wherein the polyimide film has a thickness of 75–150 μm.

7. A method of manufacturing a polyimide film according to claim 6, wherein the polyimide film has a thickness of 75–130 μm.

8. A method of manufacturing a polyimide film according to claim 1, wherein said organic phosphorous compound is a monophosphorous compound.

9. A method of manufacturing a polyimide film according to claim 1, wherein said organic phosphorus compound is a derivative of an oxy acid of phosphorous.

10. A method of manufacturing a polyimide film according to claim 1, wherein said organic phosphorous compound is a monophosphorous compound which is a derivative of an oxy acid of phosphorous.

11. A method of manufacturing a polyimide film according to claim 1, wherein said organic phosphorous compound is substantially unreactive with said polyamide acid.

12. A method of manufacturing a polyimide film according to claim 1, wherein said organic phosphorous compound is selected from the group consisting of triphenyl phosphate, methyl diethylphosphonoacetate, triphenyl phosphite, phosphoric acid tri (2-ethylhexyl) ester, tris-(2,3-dibromopropyl) phosphate, tris (2-chloroethyl) phosphate, tris (butoxyethyl) phosphate, tri-n-butyl phosphite, ethyl diethylphosphonoacetate, tris (1,3-dichloro-2-propyl) phosphate, trimethyl phosphite, trimethyl phosphate, triethyl phosphite, hexamethyltriamide phosphate, di (2-ethylhexyl)-phosphoric acid, trimethyl phosphonoacetate, triethyl phosphate, bis (2-ethylhexyl) hydrogenphosphate, dilauryl phenyl phosphite, phenylphosphonic dichloride, tridecyl phosphite, disodium phenyl phosphate, (4-ethoxybenzyl) triphenylphosphonium bromide, sodium glycerophosphate, di-p-tolylphosphoric acid sodium salt, disodium phenyl phosphate, di-p-tolylphosphoric acid calcium salt, phenylphosphonic acid, tris (4-tert-butylphenyl) phosphate, (4-butoxybenzyl) triphenylphosphonium bromide, triphenyl phosphine, iproniazid phosphate, 3-phosphoglyceric acid barium salt, methyl (triphenylphosphoranylidene) acetate, triphenylphosphine oxide, methyltriphenylphosphonium bromide, ethyltriphenylphosphonium bromide, butyltriphenylphosphonium bromide, 2-cyanoethyl phosphate barium salt, histamine diphosphate, benzyltriphenylphosphonium chloride, phosphonoacetic acid, p-nitrophenylphosphate disodium salt, 1-naphthyl phosphate monosodium salt monohydrate, vinyltriphenylphosphonium bromide, adenosine-3',5'-cyclic monophosphate, adenosine-5'-monophosphate sodium salt, phenyl dichlorophosphate, creatine phosphate sodium salt, tricresyl phosphate, urea phosphate ortho, diphenylphosphinic acid, bis[4-(methoxycarbonyl) phenyl] phosphoric acid sodium salt, , 2-carboxyethylphosphonic acid, diphenyl phosphate, tetraphenylphosphonium chloride, diethyl cyanomethylphosphonate, (3-bromopropyl) triphenylphosphonium bromide, cyclopropyltriphenylphosphonium bromide, bis (pentafluorophenyl) phenylphosphine, dimethyl (2-oxopropyl) phosphonate, (chloromethyl) triphenylphosphonium chloride, tetra-n-butylphosphonium bromide, triethyl phosphite, ethyl dichlorophosphate, p-nitrophenyl phosphorodichloridate, tri-n-butyl phosphine and hexamethylphosphorous triamide.

13. A method of improving tensile strength and flexibility of a polyimide film having a thickness of at least 75 μm and which is excellent in tensile strength and flexibility, which comprises adding a dehydration-cyclization agent, a catalyst and an organic phosphorus compound to polyamide acid, and film-forming, wherein the organic phosphorus compound is added in a range of 0.5–5 weight based on polyimide.

14. A method of manufacturing a polyimide film according to claim 1, wherein said organic phosphorus compound is triphenyl phosphate.

15. A method of improving tensile strength and flexibility of a polyimide film according to claim 13, wherein the organic phosphorus compound is added in a range of 0.7–1.5 wt % based on polyimide.

16. A method of improving tensile strength and flexibility of a polyimide film as claimed in claim 13, wherein the polyimide film has a thickness of 75–150 μm.

17. A method of improving tensile strength and flexibility of a polyimide film as claimed in claim 13, wherein the polyimide film has a thickness of 75–130 μm.

18. A method of improving tensile strength and flexibility of a polyimide film as claimed in claim 13, wherein said organic phosphorus compound is substantially unreactive with said polyamide acid.

19. A method of improving tensile strength and flexibility of a polyimide film as claimed in claim 13, wherein said organic phosphorus compound is triphenyl phosphate.

* * * * *